US012813342B2

(12) United States Patent
Fujita et al.

(10) Patent No.: US 12,813,342 B2
(45) Date of Patent: Nov. 24, 2026

(54) COMPOSITE ELECTRONIC COMPONENT

(71) Applicant: Murata Manufacturing Co., Ltd., Nagaokakyo (JP)

(72) Inventors: Yukihiro Fujita, Nagaokakyo (JP); Ryutaro Yamato, Nagaokakyo (JP); Tatsuya Funaki, Nagaokakyo (JP); Yoshiaki Satake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 378 days.

(21) Appl. No.: 18/404,939

(22) Filed: Jan. 5, 2024

(65) Prior Publication Data

US 2024/0136342 A1 Apr. 25, 2024
US 2024/0234389 A9 Jul. 11, 2024

Related U.S. Application Data

(63) Continuation of application No. PCT/JP2022/031824, filed on Aug. 24, 2022.

(30) Foreign Application Priority Data

Aug. 31, 2021 (JP) ................................ 2021-140762

(51) Int. Cl.
*H10W 90/00* (2026.01)
*H10W 20/43* (2026.01)
(Continued)

(52) U.S. Cl.
CPC .......... *H10W 90/00* (2026.01); *H10W 20/43* (2026.01); *H10W 44/601* (2026.01);
(Continued)

(58) Field of Classification Search
CPC ... H10W 90/00; H10W 20/43; H10W 44/601; H10W 70/611; H10W 70/635;
(Continued)

(56) References Cited

U.S. PATENT DOCUMENTS

2002/0041027 A1 4/2002 Sugizaki
2004/0184219 A1 9/2004 Otsuka et al.
(Continued)

FOREIGN PATENT DOCUMENTS

JP 2002118198 A 4/2002
JP 2005-064169 A * 8/2003
(Continued)

OTHER PUBLICATIONS

International Search Report in PCT/JP2022/031824, mailed Nov. 1, 2022, 4 pages.
(Continued)

*Primary Examiner* — Mohammad A Rahman
(74) *Attorney, Agent, or Firm* — Keating & Bennett, LLP

(57) ABSTRACT

A composite electronic component includes circuit layers, each including an electronic component, that are laminated, first and second circuit layers, a ceramic electronic component between the first and second circuit layers and including via electrodes extending through a body mainly including ceramic and being exposed at a corresponding one of a main surface on one side and a main surface on another side, and a sealing resin covering at least the ceramic electronic component at a location between the first and second circuit layers. At least one electronic component included in each of the first and second circuit layers are electrically connected by the via electrodes.

20 Claims, 7 Drawing Sheets

(51) Int. Cl.

| | |
|---|---|
| ***H10W 44/00*** | (2026.01) |
| ***H10W 70/60*** | (2026.01) |
| ***H10W 70/63*** | (2026.01) |
| ***H10W 70/692*** | (2026.01) |

(52) U.S. Cl.
CPC ........ *H10W 70/611* (2026.01); *H10W 70/635* (2026.01); *H10W 70/692* (2026.01)

(58) Field of Classification Search
CPC . H10W 70/692; H10W 70/60; H10W 70/614; H01G 4/1227; H01G 4/232; H01G 4/30; H01G 4/40; H05K 3/46
See application file for complete search history.

(56) References Cited

U.S. PATENT DOCUMENTS

| | | | | |
|---|---|---|---|---|
| 2007/0030628 | A1 | 2/2007 | Yamamoto et al. | |
| 2010/0020465 | A1 | 1/2010 | Fukudome | |
| 2013/0178016 | A1 | 7/2013 | Yim et al. | |
| 2017/0352603 | A1* | 12/2017 | Ichiryu | H10W 70/047 |
| 2018/0182700 | A1 | 6/2018 | Sato et al. | |
| 2020/0051956 | A1 | 2/2020 | Karhade et al. | |
| 2020/0321323 | A1 | 10/2020 | Himeda et al. | |

FOREIGN PATENT DOCUMENTS

| | | | |
|---|---|---|---|
| JP | 2004304159 | A | 10/2004 |
| JP | 2007067370 | A | 3/2007 |
| JP | 2010027899 | A | 2/2010 |
| JP | 2012151154 | A | 8/2012 |
| JP | 2013143570 | A | 7/2013 |
| JP | 2018107370 | A | 7/2018 |
| WO | 2019130746 | A1 | 7/2019 |

OTHER PUBLICATIONS

Written Opinion in PCT/JP2022/031824, mailed Nov. 1, 2022, 5 pages.

* cited by examiner

COMPOSITE ELECTRONIC COMPONENT

CROSS REFERENCE TO RELATED APPLICATIONS

This application claims the benefit of priority to Japanese Patent Application No. 2021-140762 filed on Aug. 31, 2021 and is a Continuation Application of PCT Application No. PCT/JP2022/031824 filed on Aug. 24, 2022. The entire contents of each application are hereby incorporated herein by reference.

BACKGROUND OF THE INVENTION

1. Field of the Invention

The present invention relates to composite electronic components each including a plurality of circuit layers that are laminated.

2. Description of the Related Art

A composite electronic component in which a plurality of circuit layers, each including, for example, an electronic component and a wire, are laminated is known.

As one such composite electronic component, Japanese Unexamined Patent Application Publication No. 2013-143570 discloses, as shown in FIG. 7, a package-on-package device 200 in which three semiconductor packages are laminated, the three semiconductor packages being a first semiconductor package (a first circuit layer) 201, a second semiconductor package (a second circuit layer) 202, and a third semiconductor package (a third circuit layer) 203. Each of the semiconductor packages 201, 202, and 203 has a structure in which a semiconductor chip 220 is mounted on a package substrate 210 and a periphery of the semiconductor chip 220 is covered by a resin 230.

However, in the package-on-package device 200 described in Japanese Unexamined Patent Application Publication No. 2013-143570, since electrical connection between the first semiconductor package 201 and the second semiconductor package 202 and electrical connection between the second semiconductor package 202 and the third semiconductor package 203 are each performed by using solder bumps 240, connection resistance cannot be low and thus there is room for improvement.

SUMMARY OF THE INVENTION

Example embodiments of the present invention provide composite electronic components that are each able to reduce connection resistance between a plurality of circuit layers that are laminated.

A composite electronic component according to an example embodiment of the present invention includes a plurality of circuit layers, each including an electronic component, that are laminated, the composite electronic component including a first circuit layer, a second circuit layer, a ceramic electronic component between the first circuit layer and the second circuit layer and including a plurality of via electrodes extending through a body mainly including ceramic and being exposed at a corresponding one of a main surface on one side and a main surface on another side, and a sealing resin covering at least the ceramic electronic component at a location between the first circuit layer and the second circuit layer, wherein at least one electronic component included in the first circuit layer and at least one electronic component included in the second circuit layer are electrically connected by the plurality of via electrodes of the ceramic electronic component.

With composite electronic components according to example embodiments of the present invention, since an electrical connection is performed by using via electrodes of a ceramic electronic component without using solder bumps, it is possible to reduce connection resistance.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Features of the present invention are described below by providing example embodiments of the present invention. Composite electronic components according to example embodiments of the present invention each include a plurality of circuit layers, each including an electronic component, which are laminated.

Figure 1:
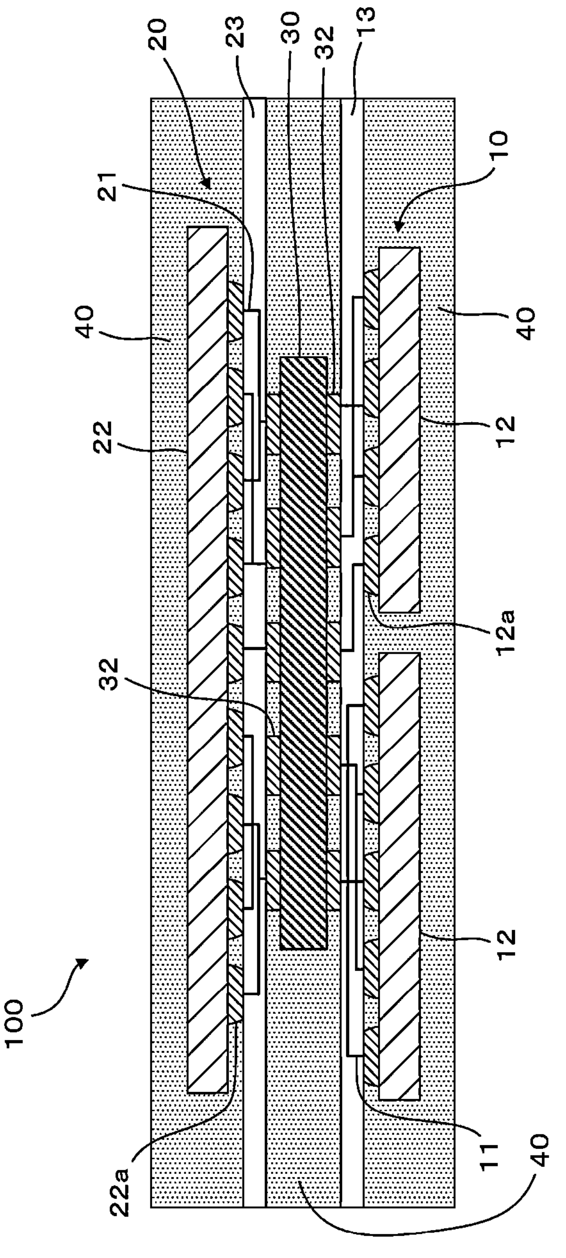
FIG. 1 is a sectional view showing a schematic structure of a composite electronic component according to an example embodiment of the present invention.

FIG. 1 is a sectional view showing a schematic structure of a composite electronic component 100 according to an example embodiment of the present invention. The composite electronic component 100 in the present example embodiment includes a first circuit layer 10, a second circuit layer 20, a ceramic electronic component 30 that is disposed between the first circuit layer 10 and the second circuit layer

20, and a sealing resin 40 that covers at least the ceramic electronic component 30 at a location between the first circuit layer 10 and the second circuit layer 20. That is, the composite electronic component 100 in the present example embodiment has a three-layer structure including the first circuit layer 10, the ceramic electronic component 30, and the second circuit layer 20 laminated one after another.

The first circuit layer 10 and the second circuit layer 20 each include a wire and an electronic component. Specifically, the first circuit layer 10 includes a first wire 11 and first electronic components 12. The second circuit layer 20 includes a second wire 21 and a second electronic component 22. Although, FIG. 1 shows, for example, two first electronic components 12, the number of first electronic components 12 included in the first circuit layer 10 is not particularly limited. Similarly, although FIG. 1 shows, for example, one second electronic component 22, the number of second electronic components 22 included in the second circuit layer 20 is not particularly limited.

In the present example embodiment, the first circuit layer 10 includes a first insulating resin 13. The first insulating resin 13 is positioned between each first electronic component 12 and the ceramic electronic component 30. The first insulating resin 13 is, for example, a polyimide resin. The thickness of the first insulating resin 13 is, for example, about 5 μm.

In the present example embodiment, the second circuit layer 20 includes a second insulating resin 23. The second insulating resin 23 is positioned between the second electronic component 22 and the ceramic electronic component 30. The second insulating resin 23 is, for example, a polyimide resin. The thickness of the second insulating resin 23 is, for example, about 5 μm.

The first wire 11 is a wire to electrically connect the first electronic components 12 to the ceramic electronic component 30, and is provided in an internal portion of the first insulating resin 13. However, a portion of the first wire 11 may be provided on a surface of the first insulating resin 13. The material of the first wire 11 may be any material as long as the material is electrically conductive and is, for example, Cu.

The second wire 21 is a wire to electrically connect the second electronic component 22 to the ceramic electronic component 30, and is provided in an internal portion of the second insulating resin 23. However, a portion of the second wire 21 may be provided on a surface of the second insulating resin 23. The material of the second wire 21 may be any material as long as the material is electrically conductive and is, for example, Cu.

When the first circuit layer 10 includes a plurality of first electronic components 12, the first circuit layer 10 may include a wire that electrically connects the first electronic components 12 to each other. Similarly, when the second circuit layer 20 includes a plurality of second electronic components 22, the second circuit layer 20 may include a wire that electrically connects the second electronic components 22 to each other.

The first electronic components 12 and the second electronic component 22 are not particularly limited in type. The first electronic components 12 and the second electronic component 22 are each, for example, a semiconductor device, such as a logic IC, being a CPU or the like, or a memory IC, being ROM, RAM, or the like.

Each first electronic component 12 is disposed in contact with the first insulating resin 13, and includes a plurality of first electrodes 12*a*. The first wire 11 electrically connects the first electrodes 12*a* of the corresponding first electronic components 12 and via electrodes 32 of the ceramic electronic component 30 described later.

The second electronic component 22 is disposed in contact with the second insulating resin 23, and includes a plurality of second electrodes 22*a*. The second wire 21 electrically connects the second electrodes 22*a* of the second electronic component 22 and via electrodes 32 of the ceramic electronic component 30 described later.

Each first electronic component 12 may include, for example, first electrodes 12*a* that extend through the first insulating resin 13 and directly contact the via electrodes 32 of the ceramic electronic component 30. Similarly, the second electronic component 22 may include second electrodes 22*a* that extend through the second insulating resin 23 and directly contact the via electrodes 32 of the ceramic electronic component 30.

Figure 3:
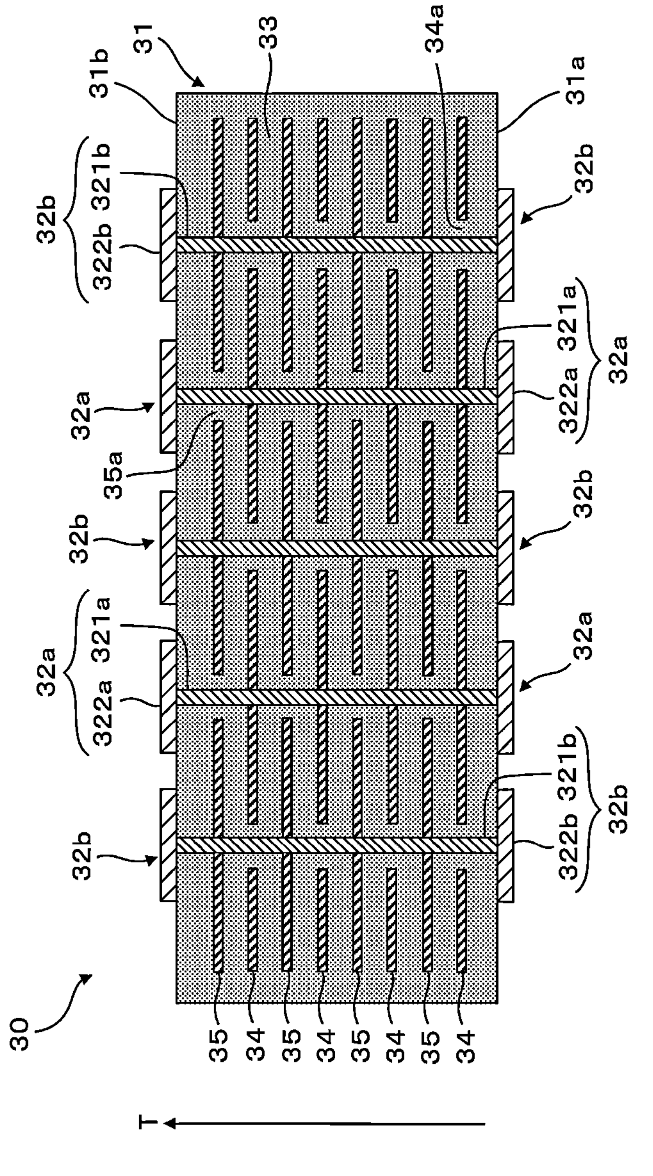
FIG. 3 is a sectional view along line of the ceramic electronic component shown in FIG. 2.

The ceramic electronic component 30 includes a plurality of via electrodes 32 that extend through a body 31 whose main component is ceramic and that are exposed at a corresponding one of a first main surface 31*a* and a second main surface 31*b*, the first main surface 31*a* being a main surface on one side and the second main surface 31*b* being a main surface on the other side (FIG. 3). More specifically, for example, the ceramic electronic component 30 includes 3 or more via electrodes 32, and, in the present example embodiment, includes 9 or more via electrodes 32. Although FIG. 1 shows one ceramic electronic component 30, 2 or more ceramic electronic components 30 may be provided. In the present example embodiment, the ceramic electronic component 30 is, for example, a multilayer ceramic capacitor.

Figure 2:
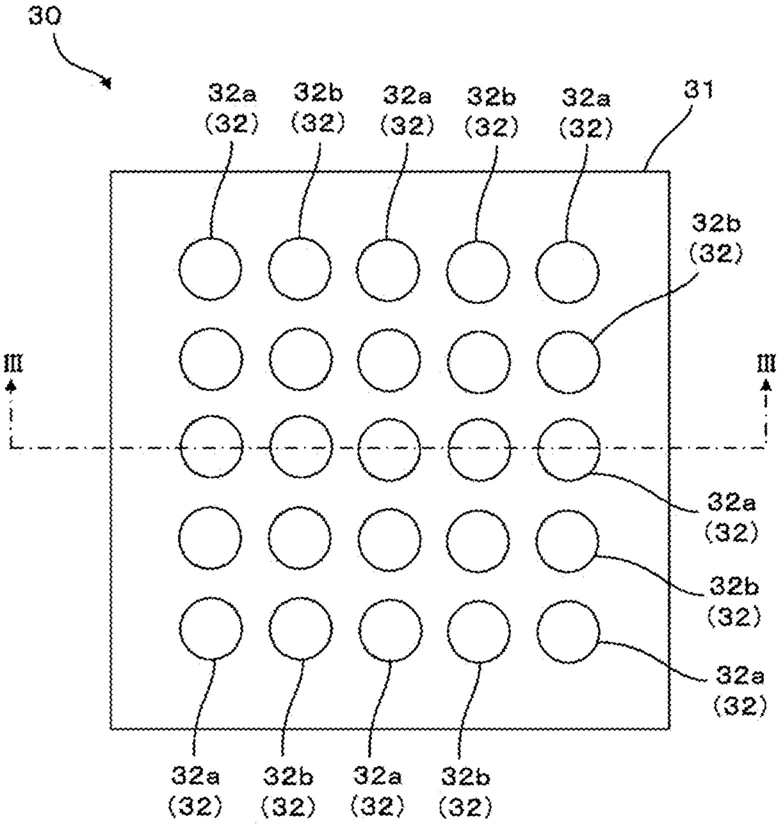
FIG. 2 is a plan view schematically showing a structure of a ceramic electronic component according to an example embodiment of the present invention.

FIG. 2 is a plan view schematically showing a structure of the ceramic electronic component 30. FIG. 3 is a sectional view along line III-III of the ceramic electronic component 30 shown in FIG. 2.

The body 31 of the ceramic electronic component 30 includes a plurality of dielectric layers 33, a plurality of first inner electrodes 34, and a plurality of second inner electrodes 35 that are laminated. More specifically, the body 31 of the ceramic electronic component 30 has a structure in which the first inner electrodes 34 and the second inner electrodes 35 are alternately laminated with the dielectric layers 33 being interposed therebetween.

Each dielectric layer 33 is made of any material whose main component is ceramic, and is made of, for example, a ceramic material whose main component is $BaTiO_3$, $CaTiO_3$, $SrTiO_3$, $SrZrO_3$, $CaZrO_3$, or the like. A subcomponent, such as, for example, an Mn compound, an Fe compound, a Cr compound, a Co compound, or an Ni compound, whose content is less than the content of the main component may be added to any of these main components.

The ceramic electronic component 30 may have any shape, and has, for example, a parallelepiped shape as a whole. "A parallelepiped shape as a whole" refers to, for example, a shape that, although not being a perfectly parallelepiped shape, includes six outer surfaces and has a parallelepiped shape as a whole, such as a shape in which corners or edge lines of a parallelepiped are rounded or a shape in which a parallelepiped has an uneven shape.

Although the ceramic electronic component 30 may have any dimensions, for example, the dimension in a length direction can be about 0.3 mm to about 3.0 mm, the dimension in a width direction can be about 0.3 mm to about 3.0 mm, and the dimension in a thickness direction can be about 30 μm to about 100 μm.

The first inner electrodes 34 and the second inner electrodes 35 may each be made of any material, and may be made of, for example, a metal, such as Ni, Cu, Ag, Pd, Pt, Fe, Ti, Cr, Sn, or Au, or an alloy including any of these metals. As a common material, the first inner electrodes 34 and the second inner electrodes 35 may include a ceramic material that is the same as dielectric ceramic contained in the dielectric layers 33. In this case, the proportion of the common material contained in the first inner electrodes 34 and the second inner electrodes 35 is, for example, about 20 vol % or less.

Although the first inner electrodes 34 and the second inner electrodes 35 may have any thickness, the thickness may be, for example, about 0.3 μm to about 1.0 μm. Although the first inner electrodes 34 and the second inner electrodes 35 may be provided in any number of layers, the number of layers of the first inner electrodes 34 and the number of layers of the second inner electrodes 35 may total, for example, 10 layers to 150 layers. As described below, although the first inner electrodes 34 and the second inner electrodes 35 are each electrically connected to at least one of the plurality of via electrodes 32, the body 31 may include inner electrodes that are not electrically connected to any of the plurality of via electrodes 32.

The first inner electrodes 34 each include a plurality of first through holes 34*a* to insert therein second via electrodes 32*b* described later. The second inner electrodes 35 each include a plurality of second through holes 35*a* to insert therein first via electrodes 32*a* described later.

The via electrodes 32 include the first via electrodes 32*a* and the second via electrodes 32*b*. The via electrodes 32 are electrically connected to a portion of the plurality of inner electrodes 34 and 35. Specifically, the first via electrodes 32*a* are electrically connected to the plurality of first inner electrodes 34, and the second via electrodes 32*b* are electrically connected to the plurality of second inner electrodes 35.

In the present example embodiment, the plurality of first via electrodes 32*a* and the plurality of second via electrodes 32*b* are provided in a matrix. More specifically, for example, as shown in FIG. 2, the first via electrodes 32*a* and the second via electrodes 32*b* that are 25 via electrodes 32 in total are orderly arranged in 5 rows and 5 columns. As shown in FIG. 2, the first via electrodes 32*a* and the second via electrodes 32*b* are alternately arranged in a row direction and a column direction.

As shown in FIG. 3, each first via electrode 32*a* includes a first via conductor 321*a* that is positioned in an internal portion of the body 31 of the ceramic electronic component 30 and first outer electrodes 322*a* that are positioned on surfaces of the body 31 of the ceramic electronic component 30. With respect to one first via conductor 321*a*, one first outer electrode 322*a* is provided on the first main surface 31*a* of the body 31 and one first outer electrode 322*a* is provided on the second main surface 31*b* of the body 31.

As shown in FIG. 3, each second via electrode 32*b* includes a second via conductor 321*b* that is positioned in the internal portion of the body 31 of the ceramic electronic component 30 and second outer electrodes 322*b* that are positioned on the surfaces of the body 31 of the ceramic electronic component 30. With respect to one second via conductor 321*b*, one second outer electrode 322*b* is provided on the first main surface 31*a* of the body 31 and one second outer electrode 322*b* is provided on the second main surface 31*b* of the body 31.

The first via conductors 321*a* are provided in the internal portion of the body 31 so as to extend in a lamination direction T of the dielectric layers 33, the first inner electrodes 34, and the second inner electrodes 35. The first via conductors 321*a* are inserted in the second through holes 35*a* of the second inner electrodes 35, as a result of which the first via electrodes 32*a* are insulated from the second inner electrodes 35.

The second via conductors 321*b* are provided in the internal portion of the body 31 so as to extend in the lamination direction T. The second via conductors 321*b* are inserted in the first through holes 34*a* of the first inner electrodes 34, as a result of which the second via electrodes 32*b* are insulated from the first inner electrodes 34.

The first via conductors 321*a* and the second via conductors 321*b* may each be made of any material, and may include, for example, a metal, such as Ni, Cu, Ag, Pd, Pt, Fe, Ti, Cr, Sn, or Au, or an alloy including any of these metals.

The first via conductors 321*a* and the second via conductors 321*b* may have any shape, and have, for example, a columnar shape. The first via conductors 321*a* and the second via conductors 321*b* in this case can have a diameter of, for example, about 30 μm to about 150 μm. The distance between adjacent ones of the first via conductors 321*a* and the second via conductors 321*b*, more specifically, the center-to-center distance between the adjacent ones of the first via conductors 321*a* and the second via conductors 321*b* is, for example, about 50 μm to about 500 μm.

On a corresponding one of the first main surface 31*a* and the second main surface 31*b* of the body 31, the first outer electrodes 322*a* are positioned so as to overlap a corresponding one of the plurality of first via conductors 321*a* when seen in the lamination direction T, and are directly connected to the corresponding one of the first via conductors 321*a*. On a corresponding one of the first main surface 31*a* and the second main surface 31*b* of the body 31, the second outer electrodes 322*b* are positioned so as to overlap a corresponding one of the plurality of second via conductors 321*b* when seen in the lamination direction T, and are directly connected to the corresponding one of the second via conductors 321*b*. The first outer electrodes 322*a* and the second outer electrodes 322*b* are disposed apart from each other.

The first outer electrodes 322*a* and the second outer electrodes 322*b* may be made of any material, and are made of, for example, Cu. However, instead of using Cu, for example, a metal, such as Ni, Ag, Pd, Pt, Fe, Ti, Cr, Sn, or Au, or an alloy including any of these metals may be used. A surface of each of the first outer electrodes 322*a* and a surface of each of the second outer electrodes 322*b* may be subjected to plating. The plating can be performed by using, for example, a metal, such as Cu, Ni, Ag, Pd, Pt, Fe, Ti, Cr, Sn, or Au, or an alloy including any of these metals. The plating may be a single layer or a plurality of layers.

At least one first electronic component 12 included in the first circuit layer 10 and at least one second electronic component 22 included in the second circuit layer 20 are electrically connected by the via electrodes 32 of the ceramic electronic component 30. That is, the ceramic electronic component 30 in the present example embodiment defines and functions as a multilayer ceramic capacitor defining the composite electronic component 100 and defines and functions as a connecting structure that electrically connects the at least one first electronic component 12 included in the first circuit layer 10 and the at least one second electronic component 22 included in the second circuit layer 20. In the present example embodiment, all of the at least one first electronic component 12 included in the first circuit layer 10 and all of the at least one second electronic component 22 included in the second circuit layer 20 are electrically connected by the via electrodes 32 of the ceramic electronic component 30.

As described above, the sealing resin 40 covers at least the ceramic electronic component 30. In the present example embodiment, of a space region between the first circuit layer 10 and the second circuit layer 20, the sealing resin 40 is provided in a portion of the space region other than where the ceramic electronic component 30 is provided. Further, in the present example embodiment, the sealing resin 40 covers the first electronic components 12 included in the first circuit layer 10 and the second electronic component 22 included in the second circuit layer 20.

However, of the first electronic components 12 included in the first circuit layer 10 and the second electronic component 22 included in the second circuit layer 20, there may be an electronic component that is not completely covered by the sealing resin 40 and that includes a partially exposed surface.

The sealing resin 40 is not particularly limited in type, and, for example, an epoxy resin including a silica filler can be used.

As described above, in the composite electronic component 100 in the present example embodiment, the at least one first electronic component 12 included in the first circuit layer 10 and the at least one second electronic component 22 included in the second circuit layer 20 are electrically connected by the via electrodes 32 of the ceramic electronic component 30. That is, in order to electrically connect the first circuit layer 10 and the second circuit layer 20, solder bumps are not provided. In the composite electronic component 100 in the present example embodiment, solder is not used even in an internal portion of the first circuit layer 10 and an internal portion of the second circuit layer 20.

A non-limiting example of a method of manufacturing the composite electronic component 100 in the present example embodiment is described with reference to FIGS. 4A to 4E and 5.

Figure 4A:
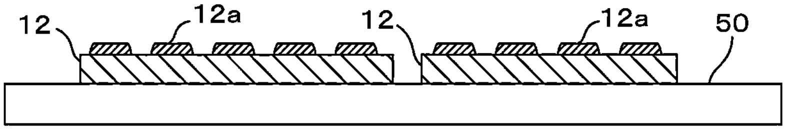
FIGS. 4A to 4E are diagrams for illustrating a non-limiting example of a method of manufacturing a composite electronic component according to an example embodiment of the present invention.

First, the first electronic components 12 are provided on a carrier wafer 50, such as, for example, silicon glass (FIG. 4A). The first electronic components 12 can be formed by laminating structural materials in a plurality of layers.

Figure 4B:
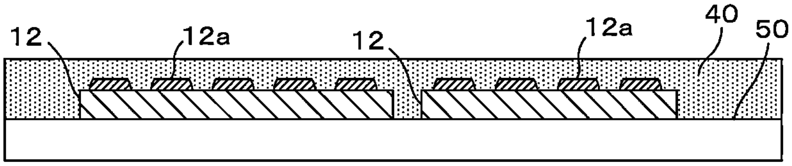

Next, the sealing resin 40 is provided so as to cover the first electronic components 12 (FIG. 4B). Next, the carrier wafer 50 on which the first electronic components 12 have been provided is disposed inside a predetermined mold, and the sealing resin 40 is caused to flow into the inside of the mold and is hardened.

Figure 4C:
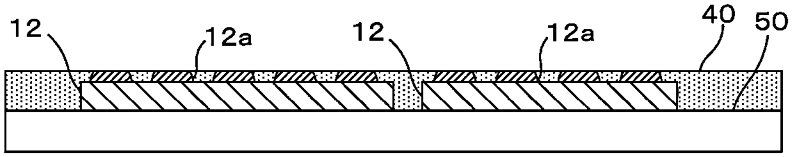

Next, a surface of the sealing resin 40 is cut away such that a surface of each first electronic component 12 is exposed (FIG. 4C).

Figure 4D:
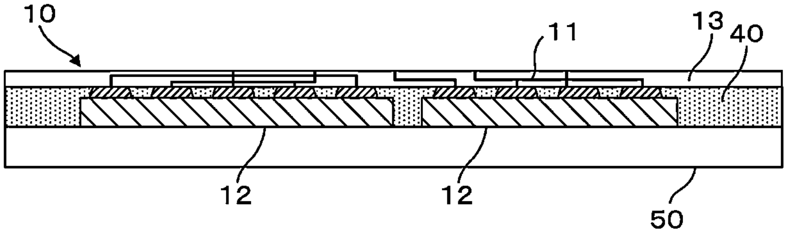

Next, the first wire 11 that is connected to the first electrodes 12*a* of each first electronic component 12 is provided, and the first insulating resin 13 is provided so as to cover the exposed first electronic components 12 (FIG. 4D). Here, as shown in FIG. 4D, the first insulating resin 13 is provided so as to cover an entire or substantially an entire surface on a side opposite to the carrier wafer 50. Of the first wire 11, a perpendicularly or substantially perpendicularly extending portion can be formed by providing vias in the first insulating resin 13 and filling the vias with a material that defines the first wire 11. As a result, the first circuit layer 10 is formed.

Figure 4E:
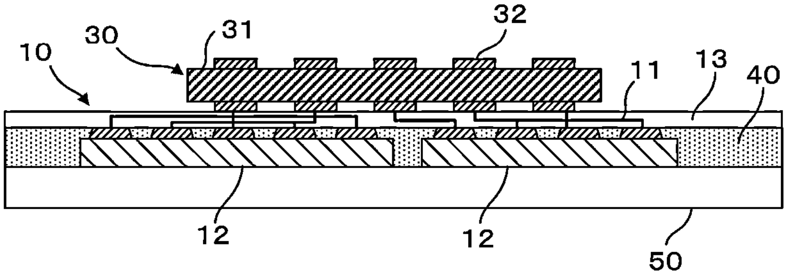

Next, the ceramic electronic component 30 is provided on the first insulating resin 13 (FIG. 4E). Here, the ceramic electronic component 30 is disposed such that the first wire 11 exposed at the surface of the first insulating resin 13 contacts the via electrodes 32 of the ceramic electronic component 30.

Figure 5A:
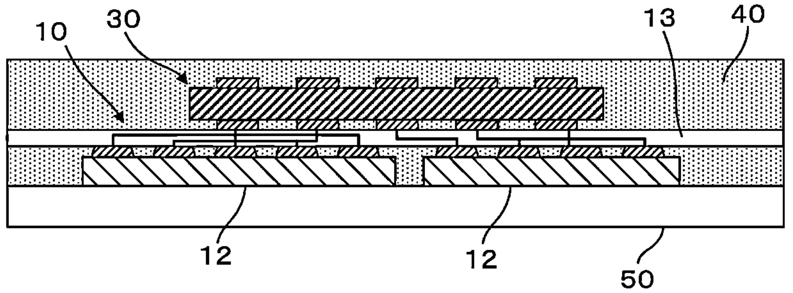
FIGS. 5A to 5D are diagrams for illustrating the non-limiting example of the method of manufacturing the composite electronic component according to an example embodiment of the present invention in continuation of FIG. 4E.

Next, the sealing resin 40 is provided so as to cover the ceramic electronic component 30 (FIG. 5A).

Figure 5B:
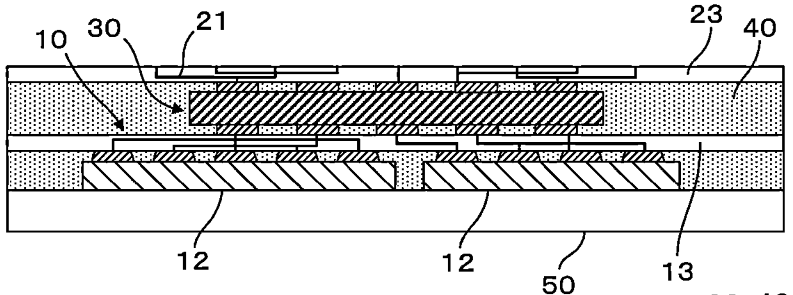

Next, after cutting away a surface of the sealing resin 40 such that a surface of the ceramic electronic component 30 is exposed, the second wire 21 that is connected to the via electrodes 32 of the ceramic electronic component 30 is provided and the second insulating resin 23 is provided (FIG. 5B).

Figure 5C:
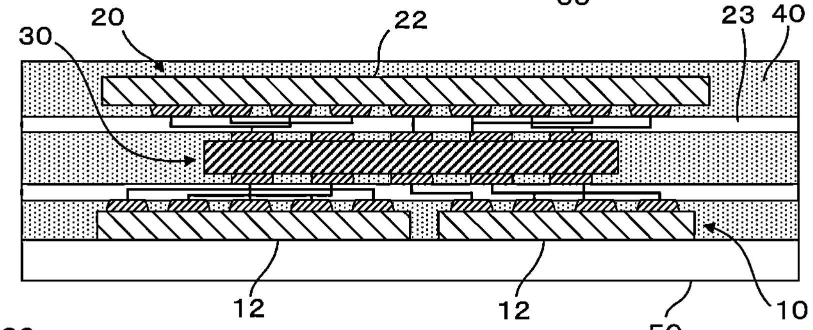

Next, after providing the second electronic component 22 on the second insulating resin 23, the sealing resin 40 is provided so as to cover the second electronic component 22 (FIG. 5C). Here, the second electronic component 22 is provided such that the second wire 21 exposed at a surface of the second insulating resin 23 contacts the second electrodes 22*a* of the second electronic component 22.

Figure 5D:
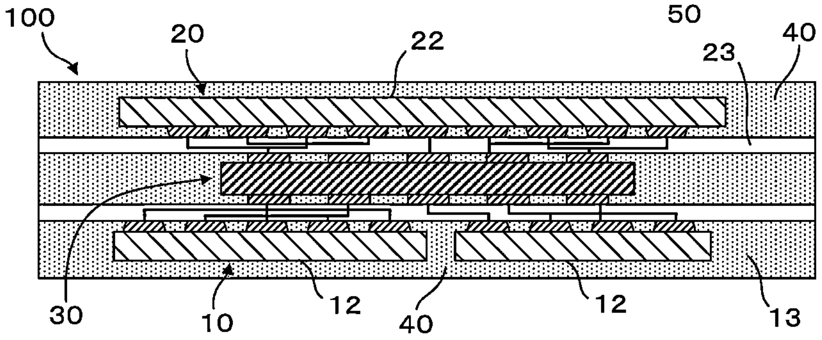

Next, the carrier wafer 50 is removed to provide the sealing resin 40 at the location where the carrier wafer 50 was disposed (FIG. 5D).

The example method described above makes it possible to manufacture the composite electronic component 100. However, the method of manufacturing the composite electronic component 100 is not limited to the above-described example manufacturing method.

According to the composite electronic component 100 in the present example embodiment, the ceramic electronic component 30, which includes the plurality of via electrodes 32 that extend through the body 31 whose main component is ceramic and that are exposed at a corresponding one of the main surface on the one side and the main surface on the other side, is disposed between the first circuit layer 10 and the second circuit layer 20, and the at least one first electronic component 12 included in the first circuit layer 10 and the at least one second electronic component 22 included in the second circuit layer 20 are electrically connected by the via electrodes 32 of the ceramic electronic component 30. Due to such a structure, compared to a structure in which the first circuit layer 10 and the second circuit layer 20 are connected by solder bumps, it is possible to reduce connection resistance and to improve the reliability of the connection.

Here, when a plurality of circuit layers are to be connected by solder bumps, a region for providing the plurality of solder bumps is required and thus the overall size is increased. In contrast, in the composite electronic component 100 in the present example embodiment, since, as in a multilayer ceramic capacitor, the electrical connection is performed by using the ceramic electronic component 30 defining the composite electronic component 100, solder bumps are not required. Therefore, it is possible to reduce the size of the composite electronic component 100.

In the composite electronic component 100 in the present example embodiment, the ceramic electronic component 30 disposed between the first circuit layer 10 and the second circuit layer 20 includes, for example, 3 or more via electrodes 32, and preferably, for example, 9 or more via electrodes 32. Therefore, it is possible to further reduce the connection resistance when electrically connecting the first electronic components 12 included in the first circuit layer 10 and the second electronic component 22 included in the second circuit layer 20.

In the composite electronic component 100 in the present example embodiment, since the ceramic electronic component 30 includes the plurality of via electrodes 32 disposed in a matrix, an arrangement design of the first wire 11 and the second wire 21 that are connected to the via electrodes 32 is simplified.

In the composite electronic component 100 in the present example embodiment, since the ceramic electronic component 30 is disposed between the first circuit layer 10 and the second circuit layer 20, compared to when a ceramic electronic component 30 is not disposed, it is possible to reduce or prevent deformation, such as warping, of the composite electronic component 100. This will be described below.

The composite electronic component 100 in the present example embodiment and a comparative composite electronic component were prepared, and their deformation degrees caused by temperature changes were examined. The prepared composite electronic component 100 includes five ceramic electronic components 30 between the first circuit layer 10 and the second circuit layer 20. On the other hand, in the comparative composite electronic component, a ceramic electronic component is not provided between the two circuit layers, and a sealing resin is provided between the two circuit layers.

Figure 6A:
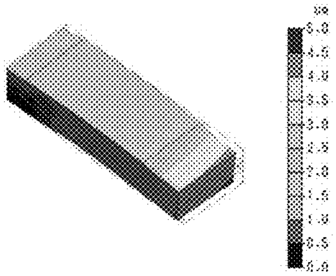
FIGS. 6A to 6D are diagrams showing a result of examining by simulation the deformation degree of a composite electronic component when cooled from about 150° C. to about 25° C., with FIG. 6A being a perspective view of a composite electronic component according to an example embodiment of the present invention, FIG. 6B being a perspective view of a comparative composite electronic component in which a ceramic electronic component is not disposed between two circuit layers, FIG. 6C being a sectional view of a composite electronic component according to an example embodiment of the present invention, and FIG. 6D being a sectional view of the comparative composite electronic component.
Figure 6B:
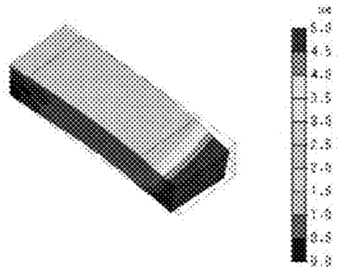
Figure 6C:
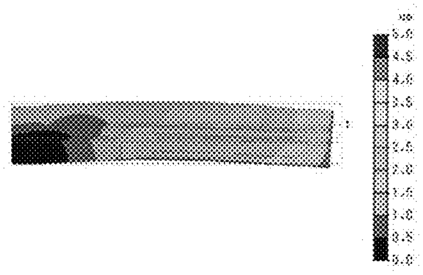
Figure 6D:
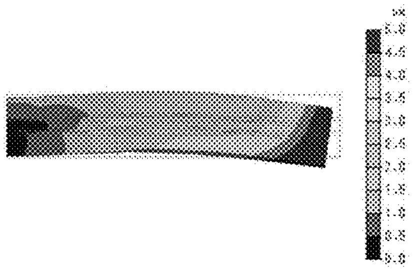
Figure 7:
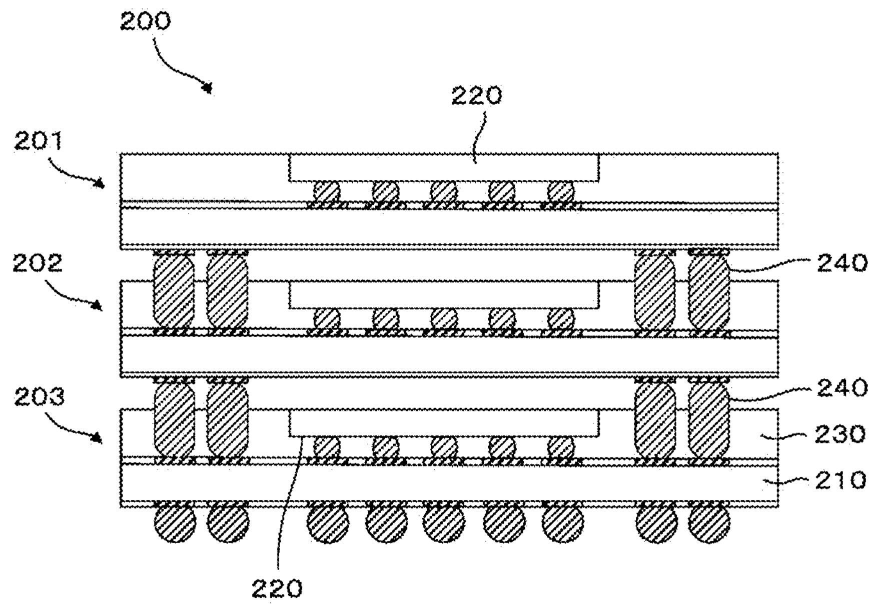
FIG. 7 PRIOR ART
FIG. 7 is a sectional view schematically showing a structure of the package-on-package device described in Japanese Unexamined Patent Application Publication No. 2013-143570.

Specifically, with there being no stress at about 150° C., the deformation degrees of the composite electronic components when cooled to about 25° C. were examined by simulation. Simulation results are shown in FIGS. 6A to 6D. FIGS. 6A and 6C show the simulation results of the composite electronic component 100 in the present example embodiment, and FIGS. 6B and 6D show the simulation results of the comparative composite electronic component. FIGS. 6A and 6B are perspective views of the composite electronic component, and FIGS. 6C and 6D are sectional views of the composite electronic component.

As shown in FIGS. 6A to 6D, in the composite electronic component 100 in which the ceramic electronic component 30 is disposed between the first circuit layer 10 and the second circuit layer 20, compared to the comparative composite electronic component in which a ceramic electronic component is not disposed between the two circuit layers, the deformation is smaller. That is, when the composite electronic component 100 includes the ceramic electronic component 30 including the body 31, whose main component is ceramic having a coefficient of linear expansion that is smaller than that of the sealing resin 40, the composite electronic component 100 in the present example embodiment is such that its deformation degree when the temperature changes is reduced.

The present invention is not limited to the example embodiments described above, and can be variously applied or modified within the scope of the present invention. For example, although, in the example embodiment described above, the ceramic electronic component 30 is described as being a multilayer ceramic capacitor, the ceramic electronic component 30 is not limited to a multilayer ceramic capacitor, and may have a structure including a plurality of via electrodes that extend through the body whose main component is ceramic and that are exposed at a corresponding one of the main surface on the one side and the main surface on the other side.

Although the composite electronic component 100 in the above-described example embodiment has a three-layer structure in which the first circuit layer 10, the ceramic electronic component 30, and the second circuit layer 20 are laminated one after another, the composite electronic component 100 may have four or more laminated layers. Even in this case, the ceramic electronic component 30 including the plurality of via electrodes 32 may be disposed between adjacent ones of the circuit layers in the lamination direction to electrically connect the electronic components included in the circuit layers by the via electrodes 32.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component including a plurality of circuit layers, each including an electronic component, which are laminated, the composite electronic component comprising:
- a first circuit layer;
- a second circuit layer;
- a ceramic electronic component between the first circuit layer and the second circuit layer and including a plurality of via electrodes extending through a body mainly including ceramic and being exposed at a corresponding one of a main surface on one side and a main surface on another side; and
- a sealing resin covering at least the ceramic electronic component at a location between the first circuit layer and the second circuit layer; wherein
- at least one electronic component included in the first circuit layer and at least one electronic component included in the second circuit layer are electrically connected by the plurality of via electrodes of the ceramic electronic component;
- the first circuit layer includes a first wire and a first electronic component;
- the second circuit layer includes a second wire and a second electronic component; and
- the first circuit layer includes a first insulating resin between the first electronic component and the ceramic electronic component.

2. The composite electronic component according to claim 1, wherein
- the ceramic electronic component is a multilayer ceramic capacitor including a plurality of dielectric layers and a plurality of inner electrodes alternately laminated; and
- the plurality of via electrodes are electrically connected to a portion of the plurality of inner electrodes.

3. The composite electronic component according to claim 1, wherein the plurality of via electrodes include three or more of the via electrodes.

4. The composite electronic component according to claim 1, wherein the plurality of via electrodes include nine or more via electrodes.

5. The composite electronic component according to claim 1, wherein the plurality of via electrodes are arranged in a matrix.

6. The composite electronic component according to claim 1, wherein a thickness of the ceramic electronic component is about 30 μm to about 100 μm.

7. The composite electronic component according to claim 1, wherein the first insulating resin includes a polyimide resin.

8. The composite electronic component according to claim 1, wherein the first wire electrically connects the first electronic component to the ceramic electronic component.

9. The composite electronic component according to claim 1, wherein the second circuit layer includes a second insulating resin between the second electronic component and the ceramic electronic component.

10. The composite electronic component according to claim 9, wherein the second insulating resin includes a polyimide resin.

11. The composite electronic component according to claim 1, wherein the second wire electrically connects the second electronic component to the ceramic electronic component.

12. The composite electronic component according to claim 1, wherein each of the first and second wires includes Cu.

13. The composite electronic component according to claim 1, wherein a thickness of the first insulating resin is about 5 μm.

14. The composite electronic component according to claim 9, wherein a thickness of the second insulating resin is about 5 μm.

15. The composite electronic component according to claim 2, wherein each of the plurality of dielectric layers includes $BaTiO_3$, $CaTiO_3$, $SrTiO_3$, $SrZrO_3$, or $CaZrO_3$ as a main component.

16. The composite electronic component according to claim 15, wherein each of the plurality of dielectric layers includes an Mn compound, an Fe compound, a Cr compound, a Co compound, or an Ni compound as a subcomponent.

17. The composite electronic component according to claim 1, wherein the ceramic electronic component has a dimension in a length direction of about 0.3 mm to about 3.0 mm, a dimension in a width direction of about 0.3 mm to about 3.0 mm, and a dimension in a thickness direction of about 30 μm to about 100 μm.

18. The composite electronic component according to claim 2, wherein each of the plurality of inner electrodes includes Ni, Cu, Ag, Pd, Pt, Fe, Ti, Cr, Sn, or Au, or an alloy including at least one of Ni, Cu, Ag, Pd, Pt, Fe, Ti, Cr, Sn, or Au.

19. A composite electronic component including a plurality of circuit layers, each including an electronic component, which are laminated, the composite electronic component comprising:

a first circuit layer;

a second circuit layer;

a ceramic electronic component between the first circuit layer and the second circuit layer and including a plurality of via electrodes extending through a body mainly including ceramic and being exposed at a corresponding one of a main surface on one side and a main surface on another side; and a sealing resin covering at least the ceramic electronic component at a location between the first circuit layer and the second circuit layer; wherein at least one electronic component included in the first circuit layer and at least one electronic component included in the second circuit layer are electrically connected by the plurality of via electrodes of the ceramic electronic component;

the first circuit layer includes a first wire and a first electronic component;

the second circuit layer includes a second wire and a second electronic component; and the first wire electrically connects the first electronic component to the ceramic electronic component.

20. A composite electronic component including a plurality of circuit layers, each including an electronic component, which are laminated, the composite electronic component comprising:

a first circuit layer;

a second circuit layer;

a ceramic electronic component between the first circuit layer and the second circuit layer and including a plurality of via electrodes extending through a body mainly including ceramic and being exposed at a corresponding one of a main surface on one side and a main surface on another side; and a sealing resin covering at least the ceramic electronic component at a location between the first circuit layer and the second circuit layer; wherein at least one electronic component included in the first circuit layer and at least one electronic component included in the second circuit layer are electrically connected by the plurality of via electrodes of the ceramic electronic component;

the first circuit layer includes a first wire and a first electronic component;

the second circuit layer includes a second wire and a second electronic component; and the second circuit layer includes a second insulating resin between the second electronic component and the ceramic electronic component.

* * * * *